(12) United States Patent
Yi et al.

(10) Patent No.: US 7,078,775 B2
(45) Date of Patent: Jul. 18, 2006

(54) MOS TRANSISTOR HAVING A MESH-TYPE GATE ELECTRODE

(75) Inventors: Duk-min Yi, Yongin (KR); Han-su Oh, Suwon (KR); Chul-ho Chung, Yongin (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/797,604

(22) Filed: Mar. 11, 2004

(65) Prior Publication Data

US 2004/0206983 A1 Oct. 21, 2004

(30) Foreign Application Priority Data

Apr. 18, 2003 (KR) .................... 10-2003-0024780

(51) Int. Cl.
*H01L 29/94* (2006.01)
(52) U.S. Cl. .................... 257/401; 257/213; 257/288; 257/368; 257/E29.111
(58) Field of Classification Search .......... 257/327, 257/328, 329, 335, 341, 342, 343, 368, 369, 257/401

See application file for complete search history.

(56) References Cited

U.S. PATENT DOCUMENTS 5,517,046 A * 5/1996 Hsing et al.

5,672,894 A 9/1997 Maeda et al.

FOREIGN PATENT DOCUMENTS

| JP | 55113378 | | 9/1980 |
| JP | 11-261056 | * | 9/1999 |
| JP | 11261056 | | 9/1999 |

OTHER PUBLICATIONS

"Field-effect transistor output driver" IBM Technical Disclosure Bulletin, IBM Corp. New York, US, vol. 28, No. 8, 1986, pp. 3497-3498, XP002088269.

* cited by examiner

*Primary Examiner*—Nathan J. Flynn
*Assistant Examiner*—Kevin Quinto
(74) *Attorney, Agent, or Firm*—Volentine Francos & Whitt, PLLC

(57) ABSTRACT

A mesh-shaped gate electrode is located over a surface of a substrate. The mesh-shaped gate electrode includes a plurality of first elongate wirings extending parallel to one another, and a plurality of second elongate wirings extending parallel to one another. The first elongate wirings intersect the second elongate wirings to define an array of gate intersection regions over the surface of the substrate and to further define an array of source/drain regions of the substrate. To reduce gate capacitance, at least one oxide region may be located in the substrate below the mesh-shaped gate electrode. For example, an array of oxide regions may be respectively located below the array of gate intersection regions.

31 Claims, 15 Drawing Sheets

MOS TRANSISTOR HAVING A MESH-TYPE GATE ELECTRODE

BACKGROUND OF THE INVENTION

1. Field of the Invention

The present invention generally relates to metal-oxide-semiconductor (MOS) devices. More particularly, the present invention relates to MOS transistors having mesh-type gate electrodes.

2. Background of the Invention

Complimentary MOS (CMOS) technology has been gaining attention as a strong candidate for current and next generation radio-frequency (RF) applications. This is because CMOS technology is characterized by relatively low process costs, high speed performance, and easy integration for SoC. For RF applications, CMOS transistors must have a large width-to-length (W/L) ratio to obtain sufficient drive power, and the CMOS transistors must further have a low gate resistance and low parasitic capacitance to operate in higher frequencies. However, increasing the W/L ratio results in an increase in the gate resistance and a decrease in operation speed. As such, in an effort to increase the W/L ratios as well as lower gate resistance, a finger-type MOS transistor has been developed as shown in FIG. 1.

Referring to FIG. 1, the finger-type MOS transistor is characterized by a gate electrode 1 having a plurality of strip electrodes 1b extending between two connecting electrodes 1a. Source regions 2 and drain regions 3 are alternately arranged between the strip electrodes 1b. In the figure, W denotes the gate width, and L denotes the length of each strip electrode 1b positioned between the source and drain regions 2 and 3. Since adjacent pairs of strip electrodes 1b share a common drain region 3, each strip electrode 1b of the finger-type MOS structure has an effective gate width-to-length ratio of 2 W/L. As such, the finger-type MOS structure exhibits a reduced gate resistance.

The gate resistance of an MOS transistor can be further reduced by adopting a mesh-type structure as shown in FIGS. 2(a) and 2(b). Referring first to FIG. 2(b), the mesh-type MOS transistor structure is characterized by mesh-type gate 100 having a plurality of first strip electrodes 100a intersecting a plurality of second strip electrodes 100b to define an array of source/drain regions S, D within an active area 120. As shown, the first strip electrodes 100a terminate at one end at a common electrode 100c. In the figure, W denotes the gate width, and L denotes the length of each strip electrode 100a and 100b between source and drain regions. The four regions directly vertically and horizontally adjacent source region S are all drain regions D, and the four regions directly vertically and horizontally adjacent the drain regions D are all source regions S. Each unit area of the mesh-type MOS structure therefore has an effective gate width-to-length ratio of 4 W/L, but gate resistance is substantially maintained. Therefore, sufficient drive power is obtained along with a low gate resistance despite the increase in the W/L ratio.

FIG. 2(a) shows additional structural details of the mesh-type MOS transistor. In this figure, reference numbers 123 and 124 denote conductive structures which overlay the gate electrode 100 (through one or more interlayer insulating layers, not shown) and which are for electrical connection to the source and drain regions, respectively, of the active area 120. Reference numbers 140 and 160 denote contact holes for connecting the source and drain regions to the conductive structures 123 and 124, respectively.

FIG. 2(c) is a cross-sectional view of a unit area of the mesh-type MOS transistor taken along line I–I' of FIG. 2(b). As shown, a gate oxide 101 is interposed between the gate 100 and active region 120 of the silicon substrate. Source and drain regions S and D are defined on opposite sides of the gate 100.

As suggested above, the gate resistance of the mesh-typed CMOS layout is significantly less than that of the finger-typed CMOS layout (4 W/L vs. 2 W/L) because of the number of alternate parallel paths at any given point in the mesh-typed structure. Disadvantageously, however the gate capacitance of the mesh-typed CMOS layout is larger than that of the finger-typed layout. As shown in FIG. 2(b), the vertical and horizontal stripe electrodes 100a and 100b intersect with one another to define a plurality of intersecting gate regions. Each of the intersecting gate regions creates a parasitic capacitance at the gate. When the transistor is turned on, current flows from each source region S to each drain region D through channels beneath the stripe electrodes 100a and 100b. On the other hand, current does not flow in the active area beneath the intersecting gate regions of the gate 100. Nevertheless, a thin gate oxide layer is present between the gate intersecting regions and the active area, and these regions thus contribute to presence of parasitic capacitance at the gate.

In the conventional mesh-typed CMOS layout exhibits a small gate resistance. However, the gate capacitance is relatively large, which makes it difficult to achieve a high power gain.

Also, while the gate resistance of the mesh-type CMOS transistor is relatively small, it would be desirable to even further reduce the resistive characteristics of the mesh-type gate MOS transistor.

SUMMARY OF THE INVENTION

According to one aspect of the present invention, a semiconductor device is provided which includes a substrate; a gate electrode located over a surface of the substrate and comprising at least first and second elongate wirings which intersect at an intersection region of the gate electrode; a gate dielectric layer interposed between the gate electrode and the surface of the substrate; and at least one oxide region located in the substrate below the intersection region of the gate electrode.

According to another aspect of the present invention, a semiconductor device is provided which includes a substrate; a mesh-shaped gate electrode located over a surface of the substrate and having a plurality of openings aligned over respective source/drain regions of the substrate; a gate dielectric layer interposed between the mesh-shaped gate electrode and the surface of the substrate; and at least one oxide region located in the substrate below the mesh-shaped gate electrode.

According to yet another aspect of the present invention, a semiconductor device is provided which includes a substrate; a mesh-shaped gate electrode located over a surface of the substrate, the mesh-shaped gate electrode having a plurality of openings aligned over respective source/drain regions of the substrate, and defining an array of gate intersection regions over the surface of the substrate and an array of source/drain regions of the substrate; a gate dielectric layer interposed between the mesh-shaped gate electrode and the surface of the substrate; and an array of oxide regions located in the substrate below the below the array of gate intersection regions, respectively; a dielectric layer formed over the semiconductor substrate and the mesh-shaped gate electrode; a plurality of elongate first electrodes located over said dielectric layer and extending parallel to each other and diagonally over said array of source/drain regions; a second dielectric layer formed over said first dielectric layer and said first electrodes; a plurality of elongate second electrodes located over said dielectric layer and extending parallel to each other and diagonally over said array of source/drain regions; wherein said first electrodes are electrically connected through said first dielectric layer to either source or drain regions among said array of source/drain regions, and wherein said second electrodes are electrically connected through said first and second dielectric layers to the other of source or drain regions among said array of source/drain regions.

According to another aspect of the present invention, a semiconductor device is provided which includes a substrate; a mesh-shaped gate electrode located over a surface of the substrate, the mesh-shaped gate electrode having a plurality of openings aligned over respective source/drain regions of the substrate; a gate dielectric layer interposed between the mesh-shaped gate electrode and the surface of the substrate; at least one oxide region located in the substrate below the mesh-shaped gate electrode; a dielectric layer formed over the semiconductor substrate and the mesh-shaped gate electrode; a plurality of elongate drain electrodes located over the dielectric layer and extending parallel to each other and diagonally over said array of source/drain regions; and a plurality of elongate source electrodes located over said dielectric layer and extending parallel to each other and diagonally over said array of source/drain regions; and wherein source electrodes and said drain electrodes are alternately arranged over said dielectric layer.

According to yet another aspect of the present invention, a semiconductor device is provided which includes a substrate; a first mesh-shaped electrode located over a surface of the substrate, the mesh-shaped electrode having a plurality of openings aligned over respective source/drain regions of the substrate; a dielectric layer interposed between the first mesh-shaped electrode and the surface of the substrate; a first dielectric layer formed over the first mesh-shaped electrode; a second mesh-shaped electrode located over said first dielectric layer,; a second dielectric layer formed over the first mesh-shaped electrode; and a third mesh-shaped electrode located over said second dielectric layer.

According to another aspect of the present invention, a semiconductor device is provided which includes a substrate having an array of source/drain regions defined therein; a mesh-shaped gate electrode located over a surface of the substrate, the mesh-shaped gate electrode having a plurality of openings aligned over respective source/drain regions of the array of source/drains region; and a gate dielectric layer interposed between the mesh-shaped gate electrode and the surface of the substrate; and at least one oxide region located in the substrate below the mesh-shaped gate electrode; wherein the mesh-shaped gate electrode comprises a plurality of first elongate wirings extending parallel to one another, a plurality of second elongate wirings extending parallel to one another, and a common wiring extending along at least one side of the array of source/drain regions.

BRIEF DESCRIPTION OF THE DRAWINGS

The various aspects and features of the present invention will become readily apparent from the detailed description that follows, with reference to the accompanying drawings, in which.

DETAILED DESCRIPTION OF THE PREFERRED EMBODIMENTS

The present invention will be described in detail below by way of several non-limiting preferred embodiments.

Certain aspects of the invention are at least partially characterized by the formation of an oxide region below a portion of the gate of an MOS transistor, particularly a mesh-type gate MOS transistor. The oxide region functions to increase an overall dielectric thickness at the portion of the gate, which in turn reduces a gate capacitance of the MOS transistor.

Other aspects of the present invention are at least partially characterized in the configuration of the source, drain and/or gate electrodes so as to minimize an overall contact resistance of a mesh-gate type MOS transistor.

Figure 3A:
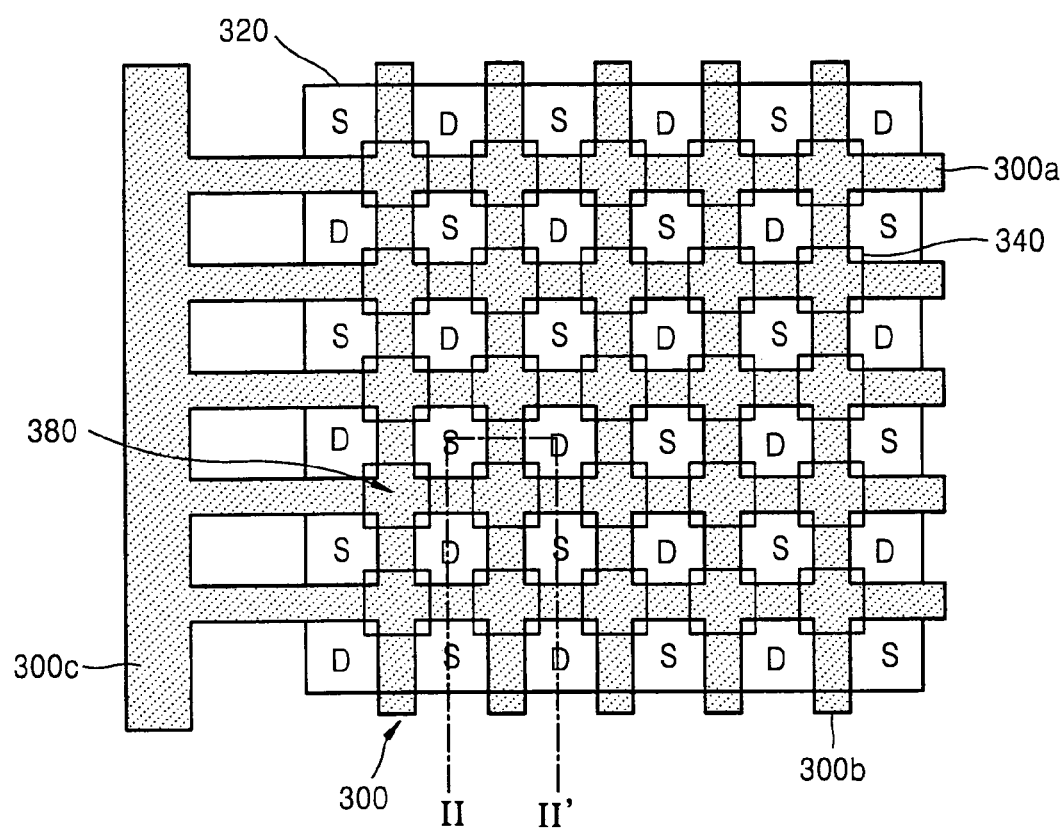
FIGS. 3(a) through 3(c) are schematic views of an MOS transistor having a mesh-type gate electrode according to an embodiment of the present invention.
Figure 3B:
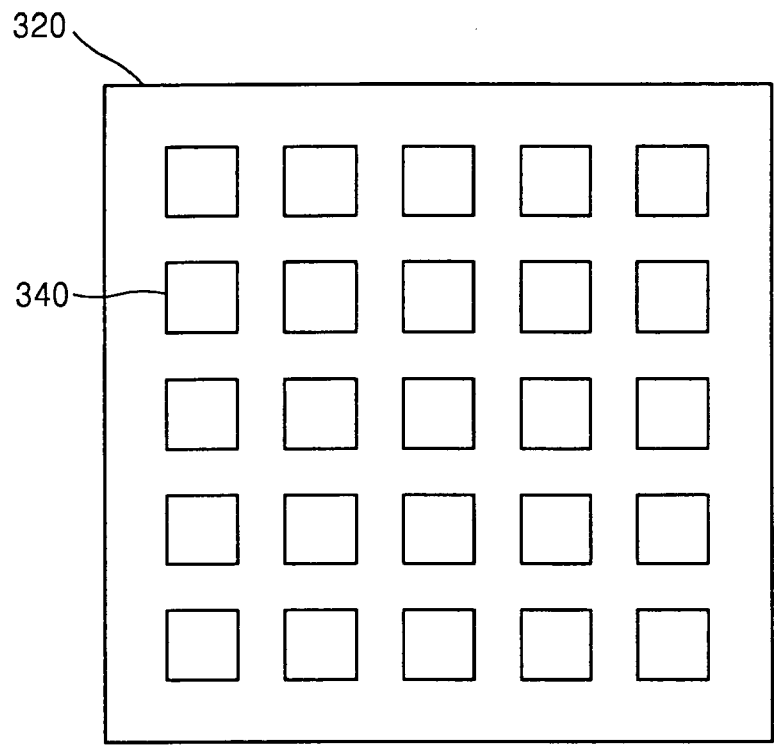
Figure 3C:
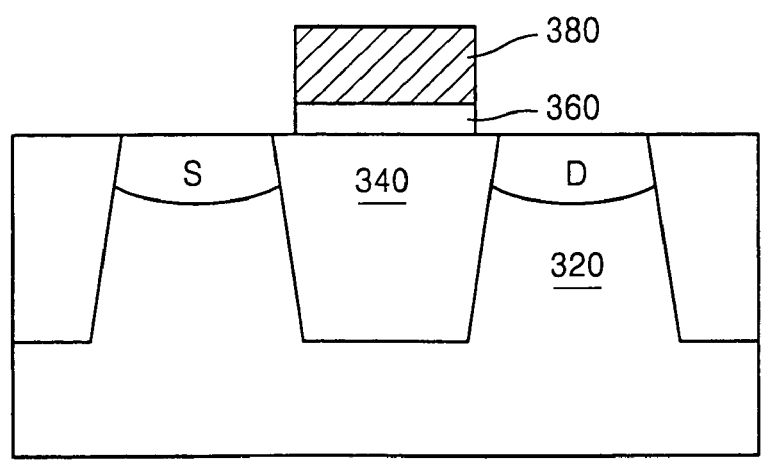

A first embodiment of the present invention is schematically illustrated in FIGS. 3(a) through 3(c). Referring first to FIG. 3(b), an active area 320 of a semiconductor substrate includes an array of oxide regions 340. Each oxide region 340 occupies a two-dimensional surface region of the active area 320 and extends to a given depth within the substrate. The given depth is thicker than a thickness of a gate dielectric (described later). Although the invention is not so limited, the oxide regions of the disclosed embodiments are implemented as field oxides regions having, for example, a depth of at least 1000 Å.

Referring next to FIG. 3(a), a mesh-type gate 300 is positioned over the active area 320. The mesh-type gate 300 includes a plurality of first strip electrodes 300a intersecting a plurality of second strip electrodes 300b to define an array of source/drain regions S,D within the active area 320. Also, in this embodiment, the first strip electrodes 300a terminate at one end at a common electrode 300c which is located outside the active area 320.

As shown, the intersecting portions 380 of the first and second stripe electrode 300a and 300b overlap the field oxide regions 340, respectively. The four regions directly vertically and horizontally adjacent each source region S are all drain regions D, and the four regions directly vertically and horizontally adjacent each drain region D are all source regions S. Each unit area of the mesh-type MOS structure therefore has an effective gate width-to-length ratio of 4 W/L, but gate resistance is substantially maintained. Therefore, sufficient drive power is obtained along with a low gate resistance despite the increase in the W/L ratio.

Further, due to the presence of the field oxide regions 340, the embodiment of FIGS. 3(a) through 3(b) exhibits a significantly reduced gate capacitance when compared with the conventional mesh-type MOS transistor. This can seen from the cross-sectional view of FIG. 3(c) which is taken along line II–II' of FIG. 3(a). The combination of the gate oxide 360 and the field oxide 340 results in an overall dielectric thickness which is substantially greater than the conventional device having the gate oxide only.

As a result, the mesh-type MOS transistor of this embodiment exhibits both a low gate resistance and a low gate capacitance.

Figure 4A:
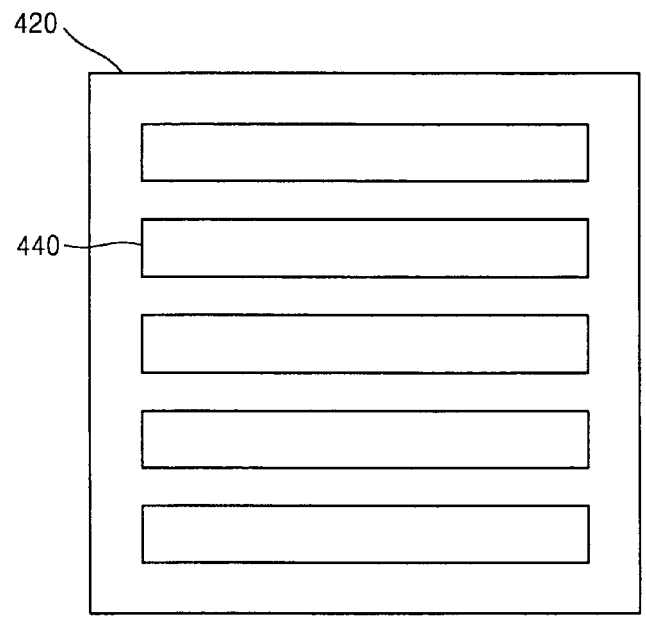
FIGS. 4(a) and 4(b) are schematic views of an MOS transistor having a mesh-type gate electrode according to another embodiment of the present invention.
Figure 4B:
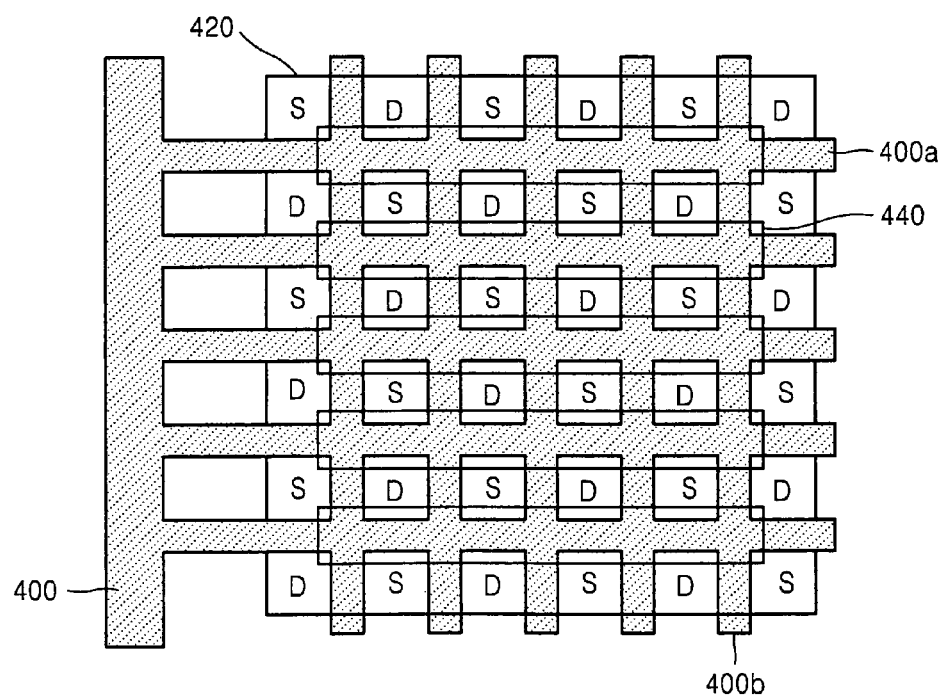

FIGS. 4(a) and 4(b) illustrate another embodiment of the present invention. Referring first to FIG. 4(a), this embodiment is characterized by the formation of elongate field oxide regions 440 in the active region 420 of a semiconductor substrate. As shown in FIG. 4(b), the field oxide regions 440 underlay the strip electrodes 400a of the gate 400. Alternately, the field oxide regions 440 may underlay the strip electrodes 400b of the gate 400.

As with the first embodiment, the configuration of FIGS. 4(a) and 4(b) exhibits an increased overall dielectric thickness resulting from the presence of the field oxide regions 440 underlying the strip electrodes 400a or 400b. As a result, the gate capacitance is advantageously reduced.

Figure 5A:
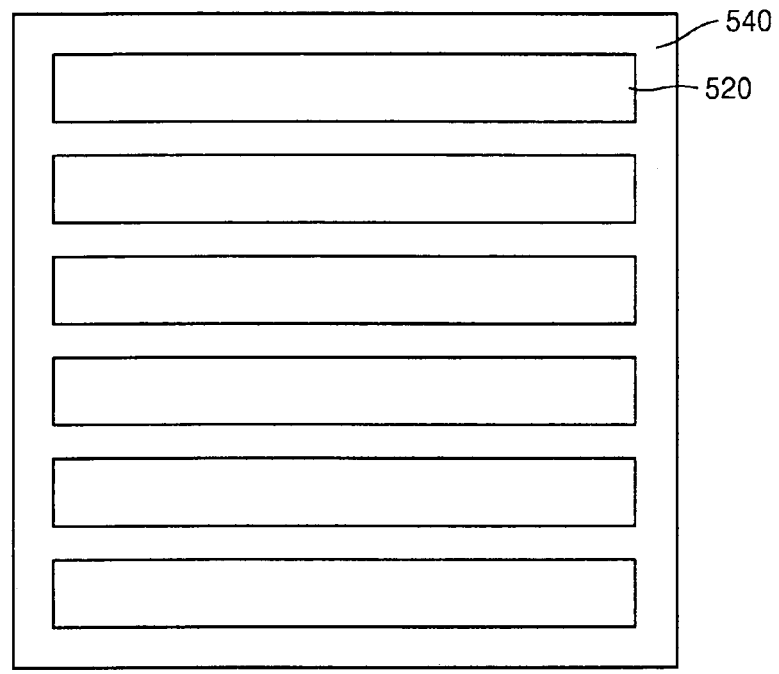
FIGS. 5(a) and 5(b) are schematic views of an MOS transistor having a mesh-type gate electrode according to yet another embodiment of the present invention.
Figure 5B:
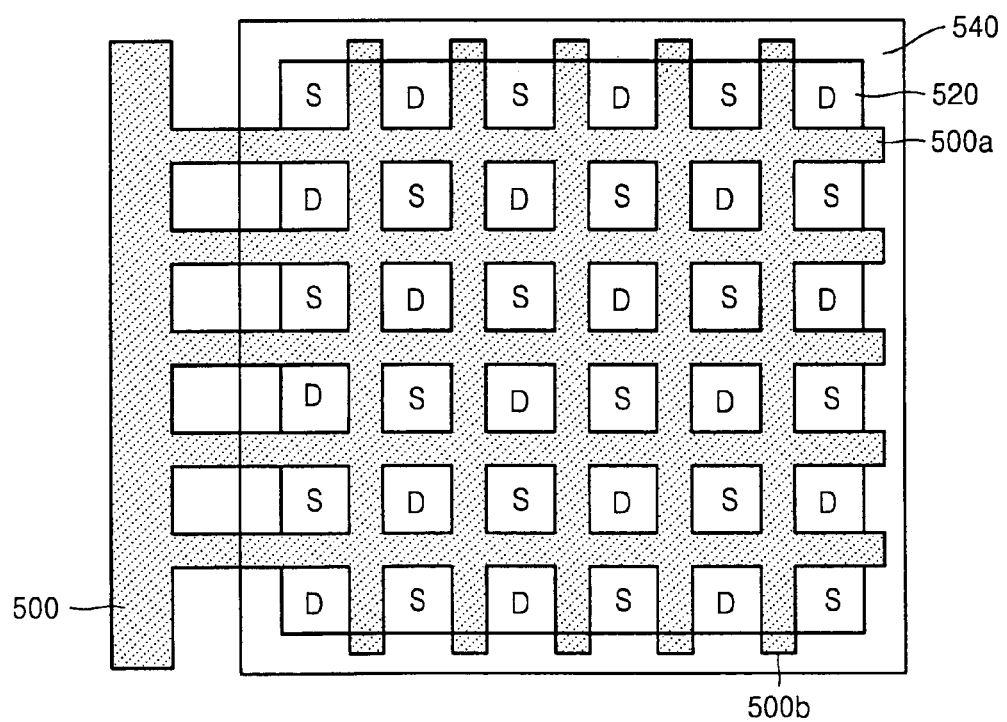

FIGS. 5(a) and 5(b) illustrate yet another embodiment of the invention. Referring first to FIG. 5(a), this embodiment is characterized by the formation of elongate active regions 520 in the field region 540 of a semiconductor substrate. Referring to FIG. 5(b), the active regions 520 are respectively aligned between the strip electrodes 500a of the gate 500. Alternately, the active regions 520 may be respectively aligned between the strip electrodes 500b of the gate 500.

As with the previous embodiments, the configuration of FIGS. 5(a) and 5(b) exhibits an increased overall dielectric thickness resulting from the presence of the field oxide region 540 underlying the strip electrodes 500a or 500b. As a result, the gate capacitance is advantageously reduced.

As described above, the gate capacitance of the mesh-type MOS transistor may be reduced by placing one or more field oxide regions below selected portions of the mesh-type gate.

Further improvements in the mesh-type MOS transistor, particularly the gate/source/drain electrode configurations, will now be described.

Figure 6A:
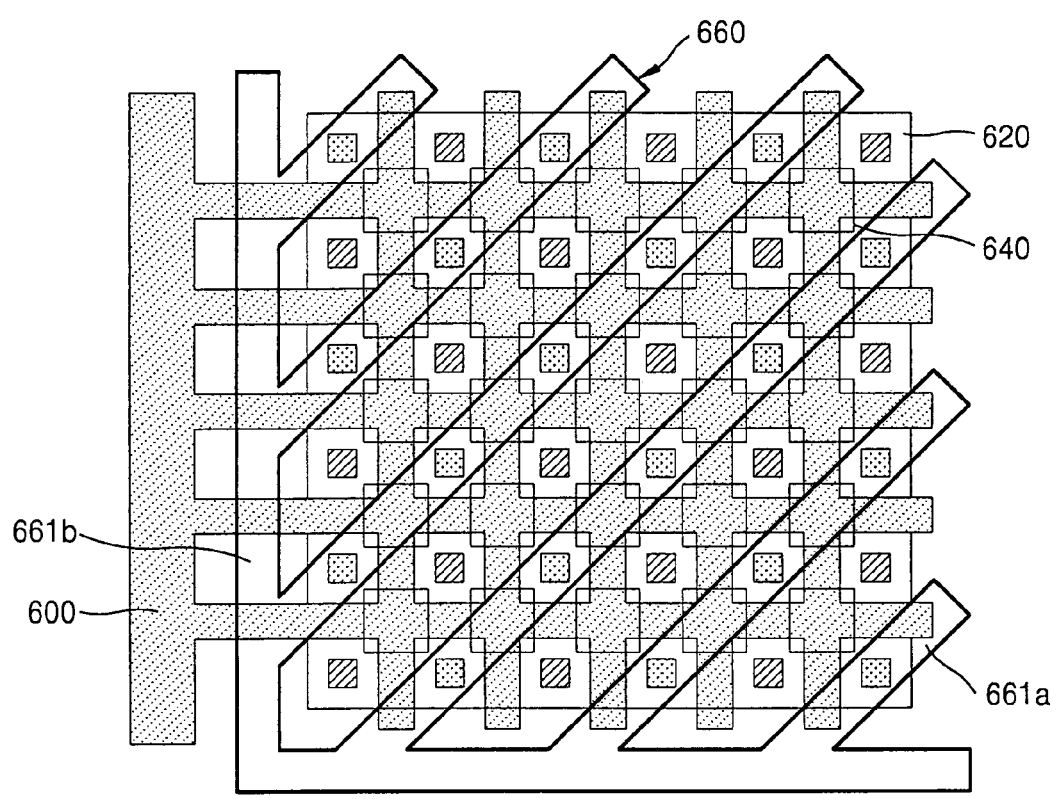
FIGS. 6(a) through 6(d) are schematic views of source and drain electrodes of a mesh-type gate MOS transistor according to an embodiment of the present invention.
Figure 6B:
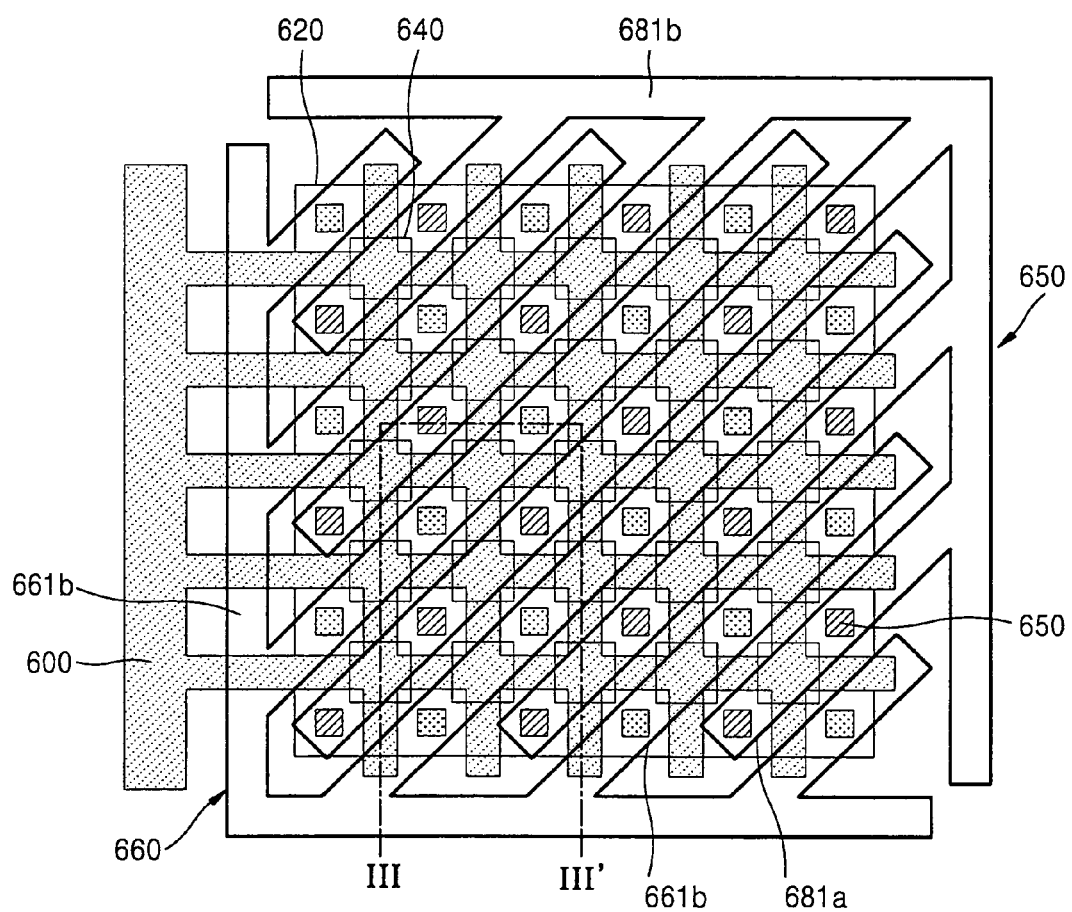
Figure 6C:
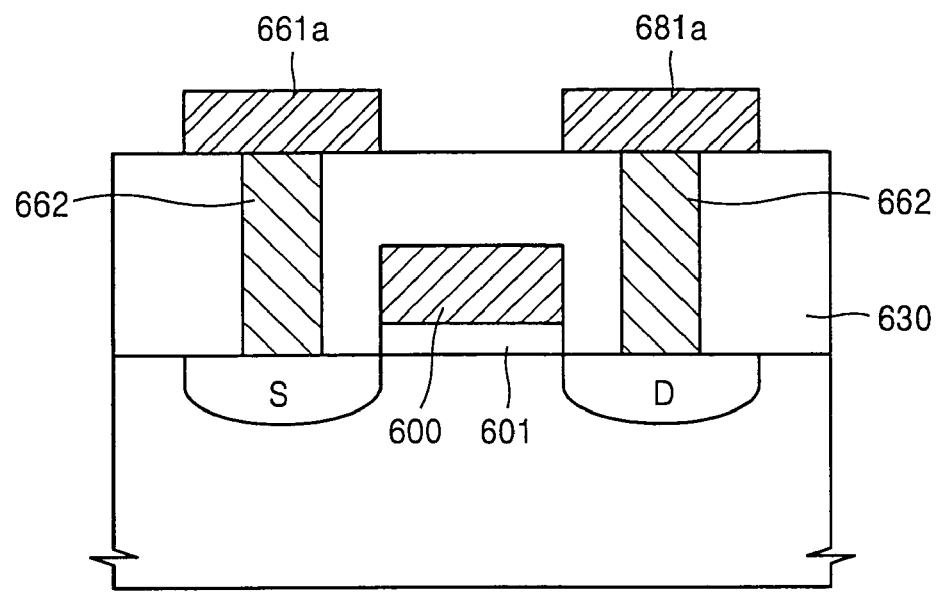

FIGS. 6(a) through 6(c) illustrate another embodiment of the present invention. Referring first to FIGS. 6(a), a source metal plate (electrode) 660 is located over a mesh-type gate 600. For example, the mesh-type gate and underlying structure may optionally be the same as that of the embodiment of FIGS. 3(a) through 5(b). The source electrode 660 is defined by a plurality of elongate strip electrodes 661a which extend diagonally over the source regions 640 among the active region 620 of the mesh-type gate MOS transistor. The strip electrodes 661a are connected at one end to a common electrode 661b.

Referring next to FIG. 6(b), a drain electrode 680 is also located over the mesh-type gate 600. The drain electrode 680 is defined by a plurality of elongate strip electrodes 681a which extend diagonally over and are connected to the drain regions 650 among the active region 620 of the MOS transistor. As shown, the strip electrodes 681a of the drain electrode 680 are parallel to and alternately arranged between the strip electrodes 661a of the source electrode 660. Also, the strip electrodes 681a are connected at one end to a common electrode 681b.

In FIGS. 6(a) and 6(b), the strip electrodes 661a and 681a a shown as extending diagonally relative to the underlying strip electrodes of the mesh-type gate. While this is preferable for optimal connection to the source and drain regions, it is also possible to extend the strip electrodes 661a and/or 681a in a direction parallel to the underlying strip electrodes of the mesh-type gate.

Preferably, each of the common electrodes 661b and 681b are L-shaped and substantially extend along the periphery of two-sides of the active region 620. In this manner, the metal area of the electrodes is increased, which in turn reduces the overall source and drain contact resistance.

In this embodiment, the source electrode 660 and drain electrode 680 are coplanar as shown in FIG. 6(c), which is a cross-sectional view taken along line III–III' of FIG. 6(b). That is, the source and drain electrodes 660, 680 are formed on a same interlayer dielectric layer 630. Each source region S is connected to the source electrode 660 by a contact hole 662 extending through the interlayer dielectric layer 630. Likewise, each drain region D is connected to the drain electrode 680 by a contact hole 682 extending through the interlayer dielectric layer 630. Since the source and drain electrodes are located on the same interlayer dielectric layer, they can be simultaneously formed, for example, using conventional photolithography techniques.

Figure 6D:
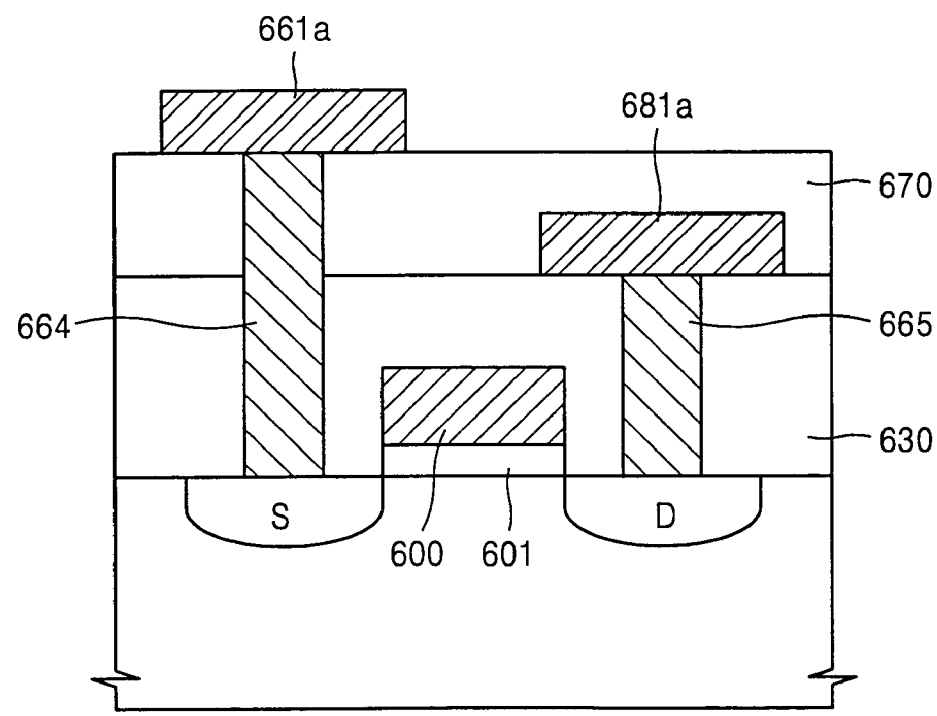

In an alternative embodiment, the source electrode 660 and the drain electrode 680 lie in different planes as shown in cross-sectional view of FIG. 6(d). In this case, the drain electrode 680 is formed on a first interlayer dielectric layer 630, and the source electrode is formed on a second interlayer dielectric layer 670. Each source region S is connected to the source electrode 660 by a contact hole 664 extending through the first and second interlayer dielectric layers 630, 650. Likewise, each drain region D is connected to the drain electrode 680 by a contact hole 682 extending through the first interlayer dielectric layer 630.

In the case of FIG. 6(d), the elongate strip electrode 661a of the source electrode 660 need not run parallel to the elongate strip electrodes 681a of the drain electrode 680 as shown in FIG. 6(b). Rather, for example, the strip electrodes 661a of the source electrode 660 can run perpendicularly to the strip electrodes 681a of the drain electrode 680.

Figure 1:
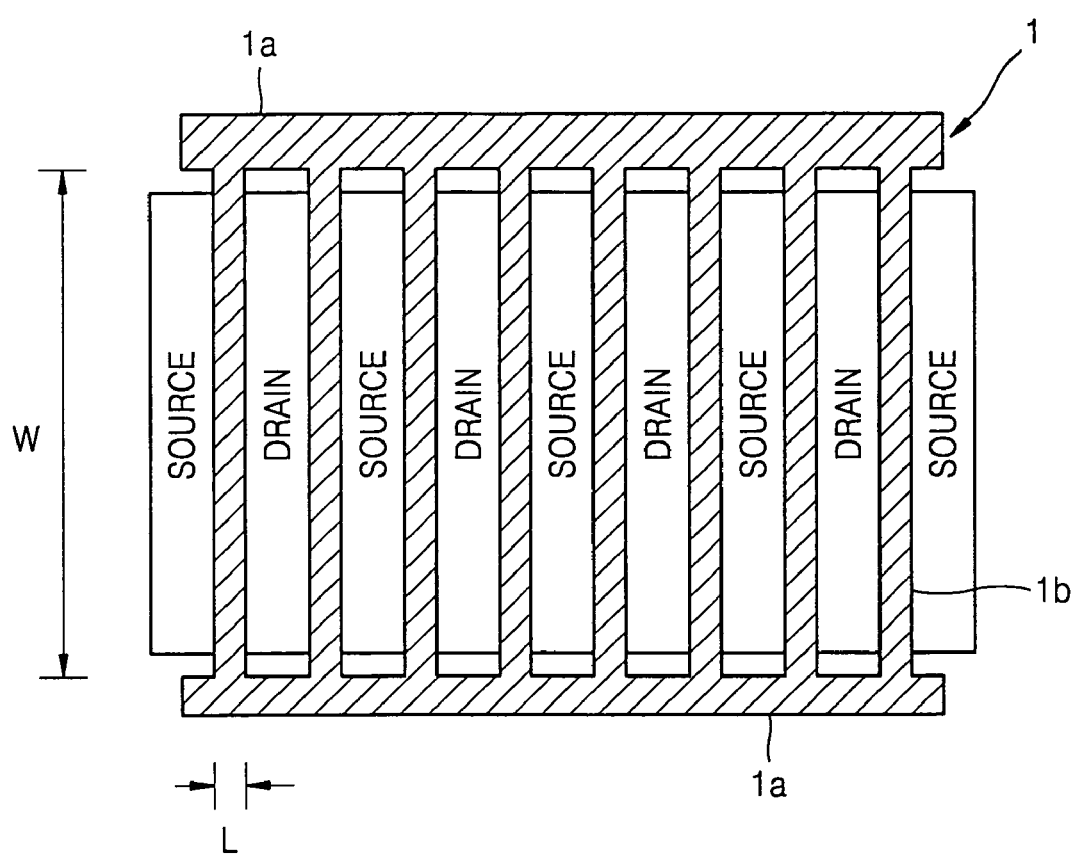
FIG. 1 is a schematic view of a conventional MOS transistor having a finger-type gate electrode.
Figure 2A:
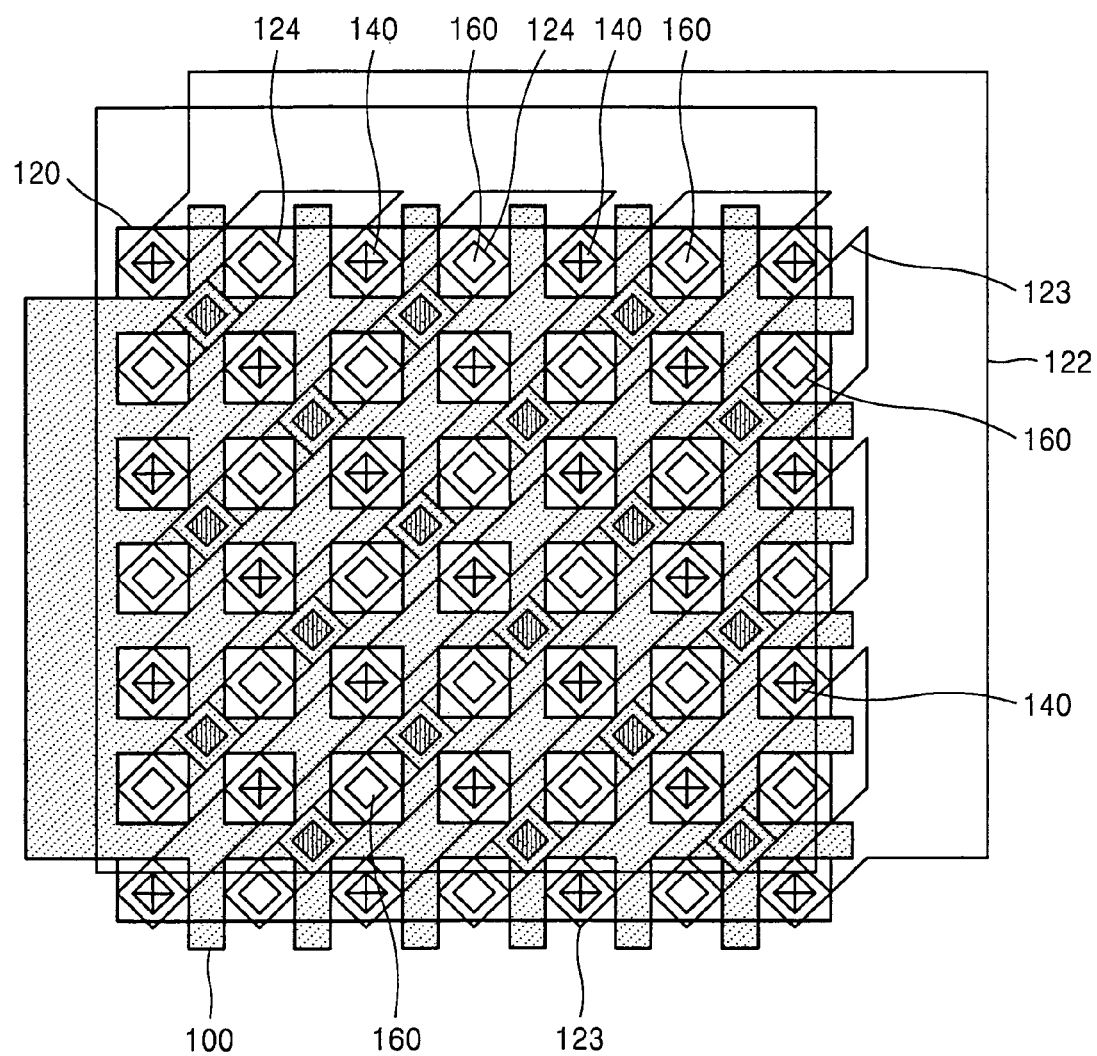
FIGS. 2(a) through 2(c) are schematic views of a conventional MOS transistor having a mesh-type gate electrode.
Figure 2B:
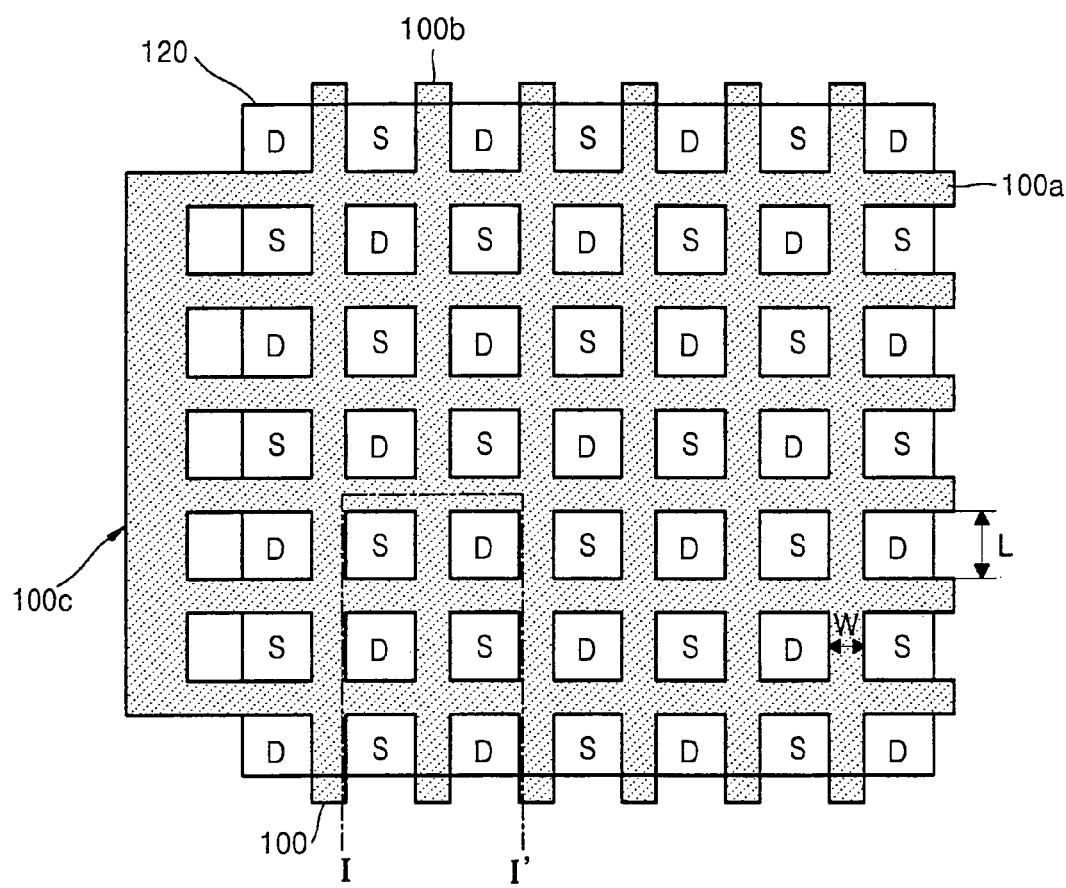
Figure 2C:
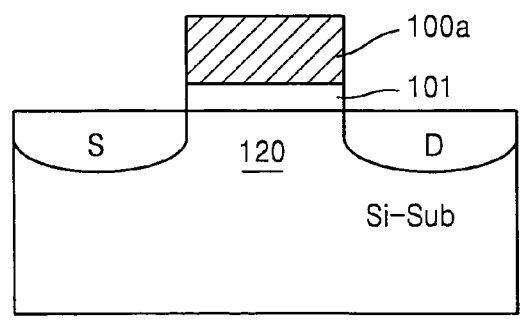
Figure 7A:
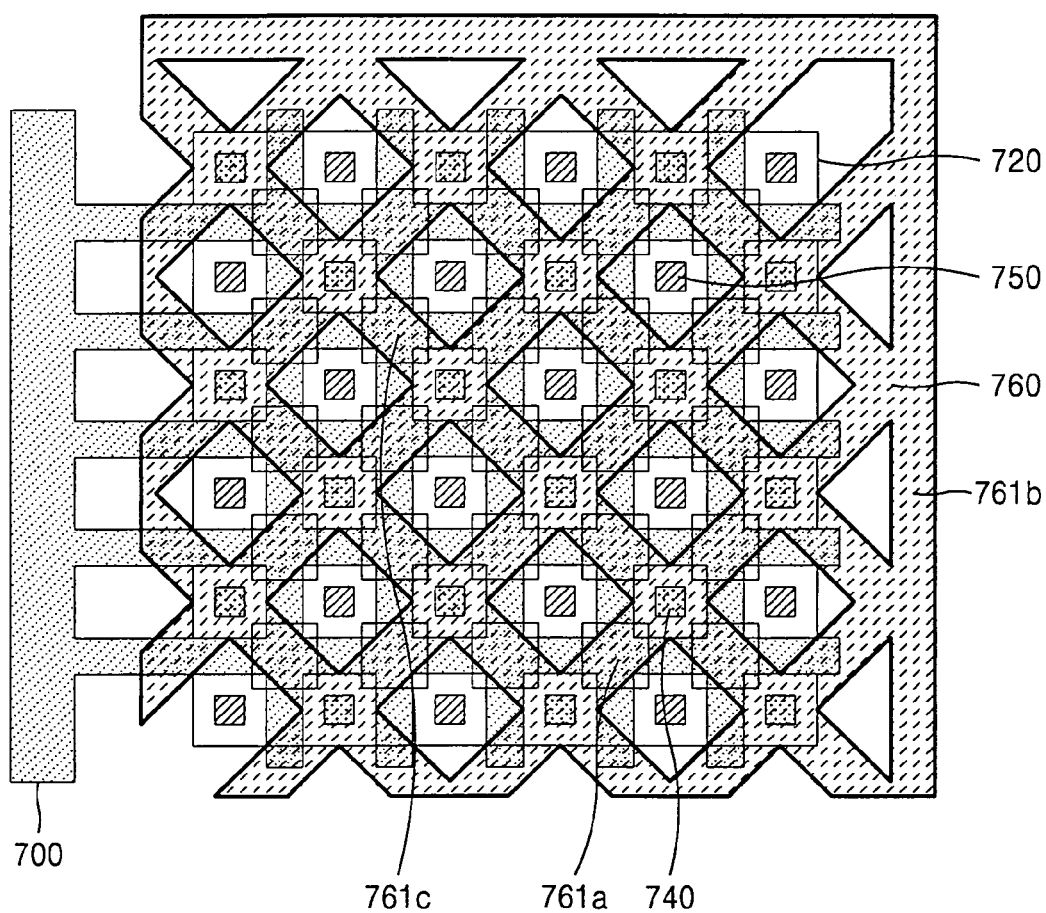
FIG. 7(a) through 7(c) are schematic views of source and drain electrodes of a mesh-type gate MOS transistor according to another embodiment of the present invention.
Figure 7B:
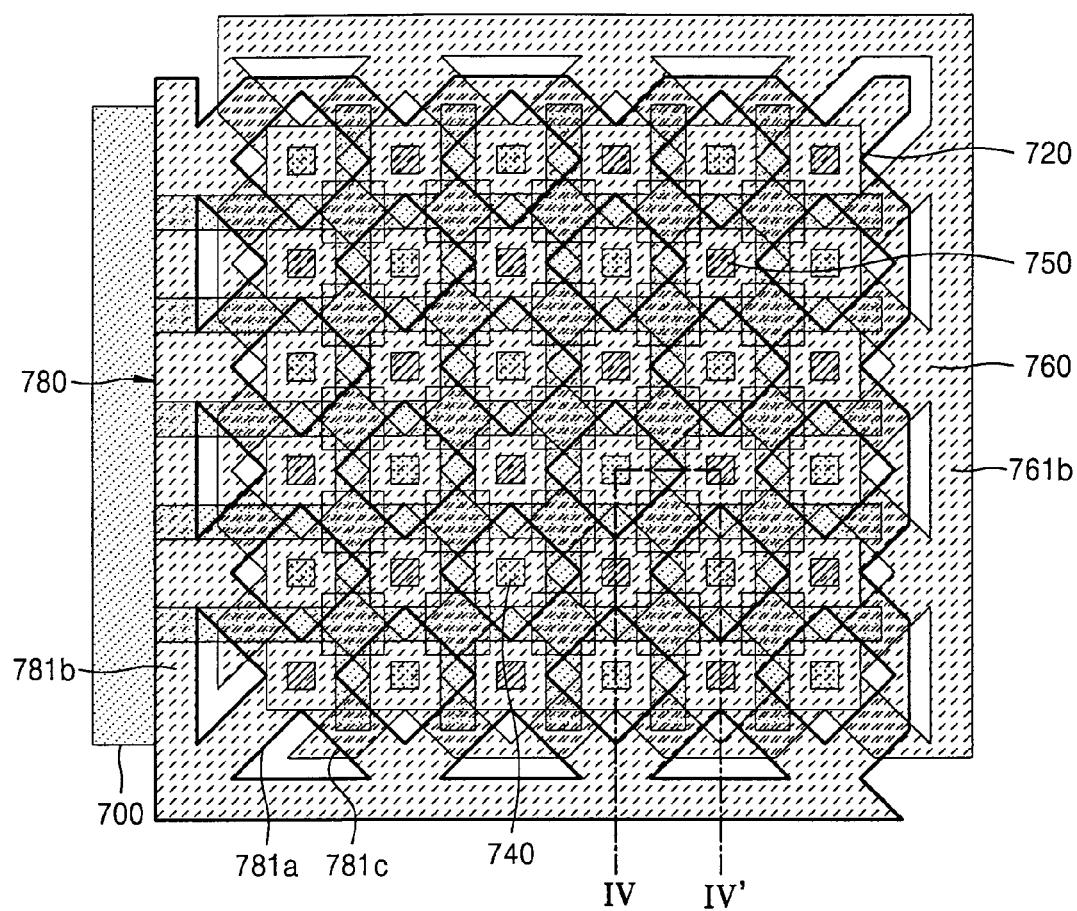

As mentioned above, the overall source and drain contact resistance can be reduced by the formation of the L-shaped common electrodes 661c and 681c. This resistance can be further reduced by adopting the embodiment shown in FIGS. 7(a) through 7(c). Referring first to FIG. 7(a), a source metal plate (electrode) 760 is located over a mesh-type gate 700. For example, the mesh-type gate 700 and underlying structure are optionally the same as those of the embodiment of FIGS. 1(a) through 1(c). The source electrode 760 is defined by a first plurality of elongate strip electrodes 761a which extend diagonally over the source regions of the MOS transistor. The strip electrodes 761a are connected at one end to a common L-shaped electrode 761b. The source electrode 760 is further defined by a second plurality of elongate strip electrodes 761c also extend diagonally over the source regions but at substantial right angles to the first strip electrodes 761a.

The drain electrode is similarly configured. That is, referring to FIG. 7(b), a drain metal plate (electrode) 780 is located over the source electrode 760. The drain electrode 780 is defined by a first plurality of elongate strip electrodes 781a which extend diagonally over the drain regions of the MOS transistor. The strip electrodes 781a are connected at one end to a common L-shaped electrode 781b. The drain electrode 780 is further defined by a second plurality of elongate strip electrodes 781c which also extend diagonally over the drain regions but at right angles to the first strip electrodes 781a.

Figure 7C:
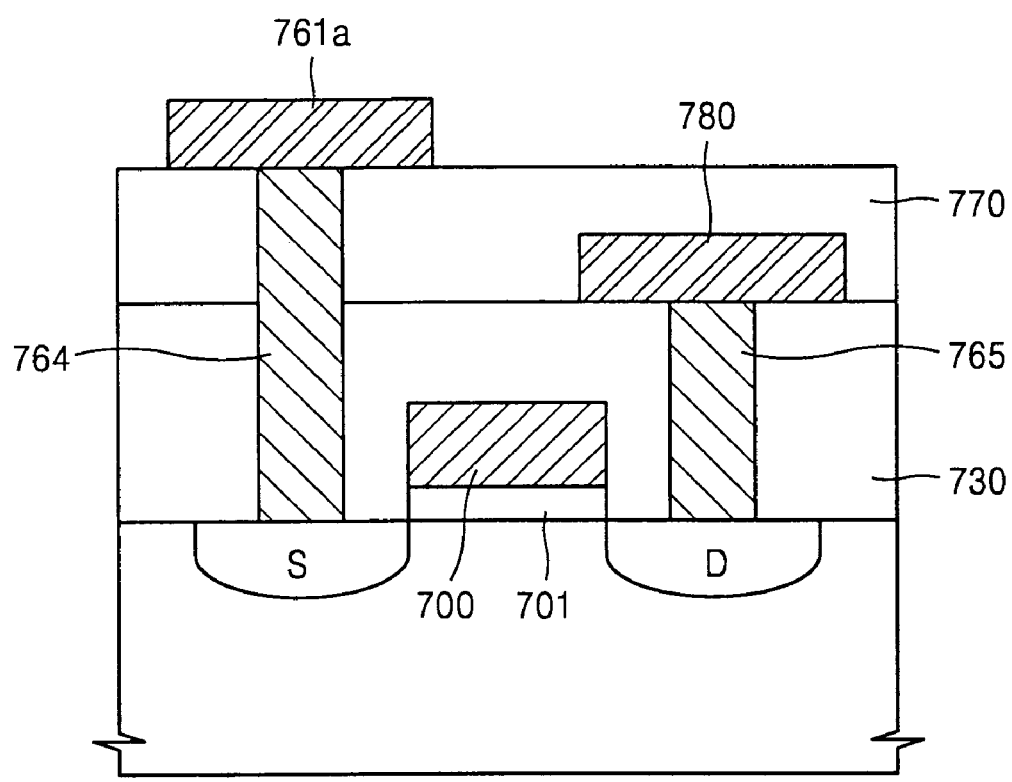

FIG. 7(c) is a cross-sectional view taken along line IV–IV' of FIG. 7(c). The source electrode 760 is formed on a first interlayer dielectric layer 730, and the drain electrode 780 is formed on a second interlayer dielectric layer 770. Each source region S is connected to the source electrode 760 by a contact hole 764 extending through the first and second interlayer dielectric layers 730, 770. Likewise, each drain region D is connected to the drain electrode 780 by a contact hole 782 extending through the first interlayer dielectric layer 730.

Still further improvements in the mesh-type MOS transistor, particularly the gate electrode structure, will now be described.

Figure 8A:
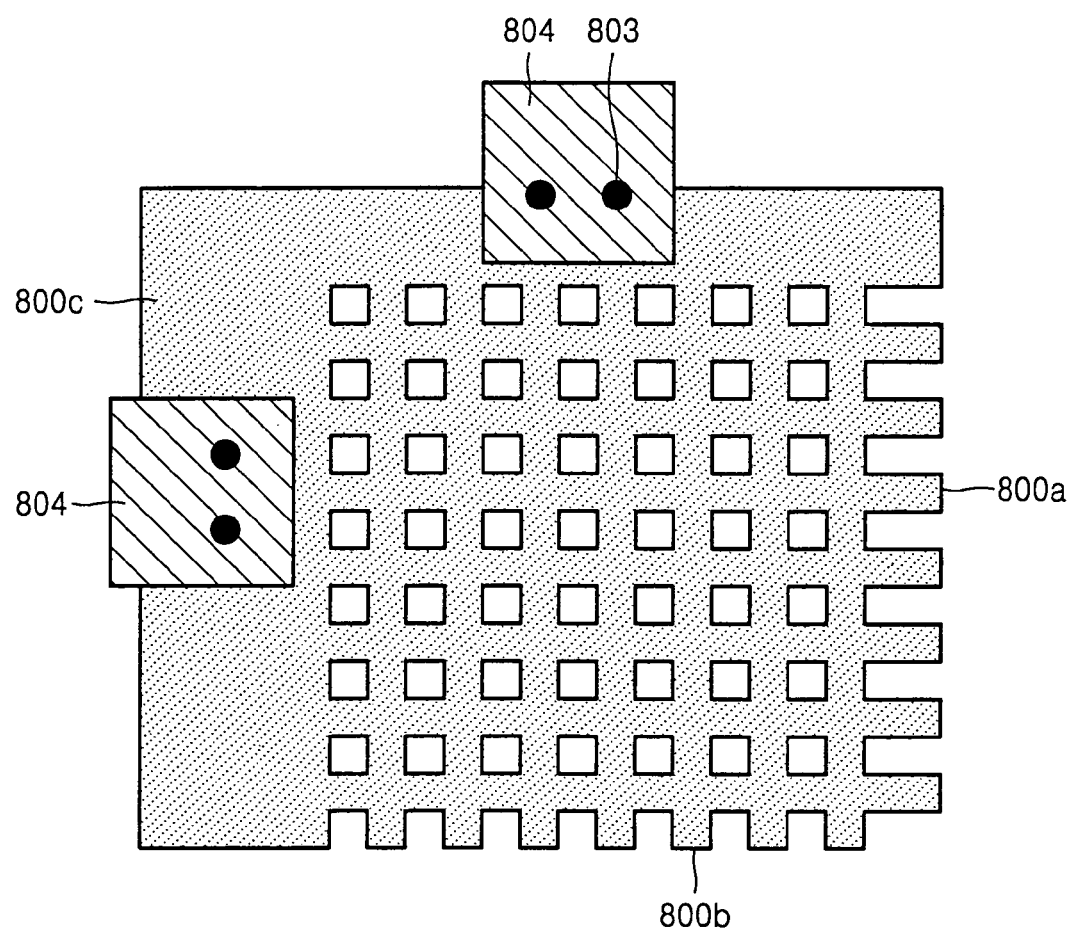
FIGS. 8(a) and 8(b) are schematic views of gate electrodes of a mesh-type gate MOS transistor according to an embodiment of the present invention.

FIG. 8(a) schematically illustrates a mesh-type gate electrode according to an embodiment of the invention. The mesh-type gate includes a plurality of first strip electrodes 800a intersecting a plurality of second strip electrodes 800b to define an array of source/drain regions over an active area of a semiconductor substrate. As shown, the first strip electrodes 800a terminate at one end at one side of the common L-shaped electrode 800c, and the second strip electrodes 800b terminate at one end at another side of a common L-shaped electrode 800c. Each side of the L-shaped common electrode 800c is connected to an upper layer metal wiring 804 via one or more contact holes 803.

Figure 8B:
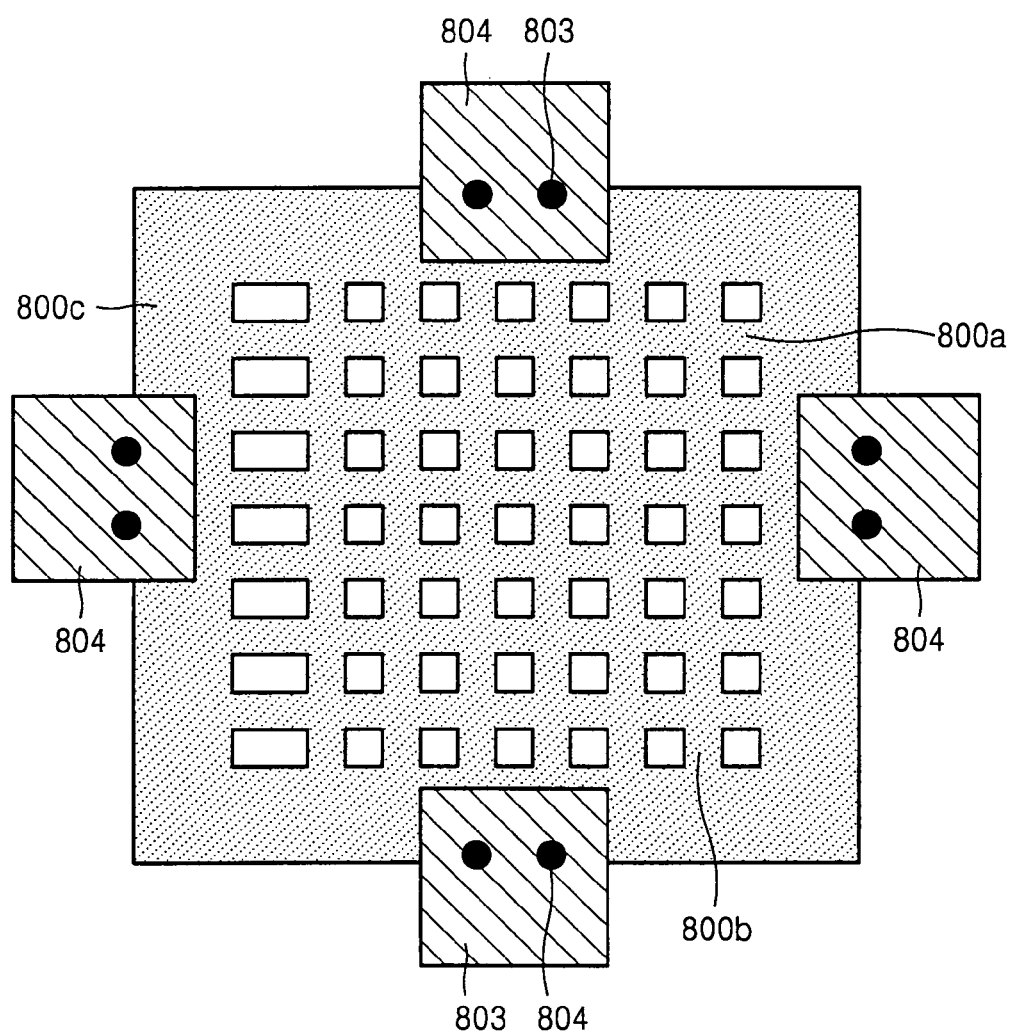

An alternative mesh-type gate electrode according to an embodiment of the present invention is shown in FIG. 8(b). In this case, the common electrode 800c extends along all four sides of the active area. That is, the first strip electrodes 800a terminate at both ends at opposite sides of the common electrode 800c, and the second strip electrodes 800b terminate at both ends at other opposite sides of the common electrode 800c. Again, each side of the common electrode 800c is connected to an upper layer metal wiring 804 via one or more contact holes 803.

Since the mesh-type gate is connected at multiple and distributed points to the metal wiring, the embodiments of FIGS. 8(a) and 8(b) favorably exhibit a reduce contact resistance at the gate electrode.

In the drawings and specification, there have been disclosed typical preferred embodiments of this invention and, although specific examples are set forth, they are used in a generic and descriptive sense only and not for purposes of limitation. It should therefore be understood the scope of the present invention is to be construed by the appended claims, and not by the exemplary embodiments.

What is claimed is:

1. A semiconductor device comprising:
   a substrate;
   a mesh-shaped gate electrode located over a surface of the substrate, the mesh-shaped gate electrode having a plurality of openings aligned over respective source/drain regions of the substrate;
   a gate dielectric layer interposed between the mesh-shape gate electrode and the surface of the substrate; and
   at least one oxide region located in the substrate below the mesh-shaped gate electrode, wherein a thickness of the oxide region is greater than a thickness of the gate dielectric layer,
   wherein the mesh-shaped gate electrode comprises a plurality of first elongate wirings extending parallel to one another, and a plurality of second elongate wirings extending parallel to one another, and wherein the first elongate wirings intersect the second elongate wirings to define an array of gate intersection regions over the surface of the substrate and to further define an array of source/drain regions of the substrate, and
   wherein the at least one oxide region comprises a plurality of elongate oxide regions extending parallel to each other and lengthwise below the first elongate wirings of the mesh-shaped gate electrode.

2. The semiconductor device as claimed in claim 1, wherein each of the plurality of elongate oxide regions have opposite ends which terminate at first and second elongate side oxide regions extending perpendicular to said plurality of elongate oxide regions.

3. A semiconductor device comprising:
   a substrate;
   a mesh-shaped gate electrode located over a surface of the substrate, the mesh-shaped sate electrode having a plurality of openings aligned over respective source/drain regions of the substrate;
   a gate dielectric layer interposed between the mesh-shape gate electrode and the surface of the substrate; and
   at least one oxide region located in the substrate below the mesh-shaped gate electrode, wherein a thickness of the oxide region is greater than a thickness of the gate dielectric layer,
   wherein the mesh-shaped gate electrode comprises a plurality of first elongate wirings extending parallel to one another, and a plurality of second elongate wirings extending parallel to one another, and wherein the first elongate wirings intersect the second elongate wirings to define an array of gate intersection regions over the surface of the substrate and to further define an array of source/drain regions of the substrate, and
   said semiconductor device further comprising a common wiring located along at least one side of the array of source/drain regions, wherein each of the first and second elongate wirings are connected to the common wiring.

4. The semiconductor device as claimed in claim 3, wherein the common wiring surrounds the array of source/drain regions.

5. A semiconductor device comprising:
   a substrate;
   a mesh-shaped gate electrode located over a surface of the substrate, the mesh-shaped gate electrode having a plurality of openings aligned over respective source/drain regions of the substrate;
   a gate dielectric layer interposed between the mesh-shape gate electrode and the surface of the substrate; and
   at least one oxide region located in the substrate below the mesh-shaped gate electrode, wherein a thickness of the oxide region is greater than a thickness of the gate dielectric layer,
   wherein the mesh-shaped gate electrode comprises a plurality of first elongate wirings extending parallel to one another, and a plurality of second elongate wirings extending parallel to one another, and wherein the first elongate wirings intersect the second elongate wirings to define an array of gate intersection regions over the surface of the substrate and to further define an array of source/drain regions of the substrate, and
   said semiconductor device further comprising;
   a dielectric layer formed over the semiconductor substrate and the mesh-shaped gate electrode;
   a plurality of elongate drain electrodes located over the dielectric layer and extending parallel to each other and diagonally over said array of source/drain regions;

a plurality of elongate source electrodes located over said dielectric layer and extending parallel to each other and diagonally over said array of source/drain regions;

wherein said source electrodes are electrically connected through said dielectric layer to source regions among said source/drain regions, and wherein said drain electrodes are electrically connected through said dielectric layer to drain regions among said array of source/drain regions, and wherein source electrodes and said drain electrodes are alternately arranged over said dielectric layer.

6. The semiconductor device as claimed in claim 5, further comprising:

a common source electrode connected to said plurality of source electrodes; and a common drain electrode connected to said plurality of drain electrodes.

7. A semiconductor device comprising:

a substrate;

a mesh-shaped gate electrode located over a surface of the substrate, the mesh-shaped gate electrode having a plurality of openings aligned over respective source/drain regions of the substrate;

a gate dielectric layer interposed between the mesh-shape gate electrode and the surface of the substrate; and at least one oxide region located in the substrate below the mesh-shaped gate electrode, wherein a thickness of the oxide region is greater than a thickness of the gate dielectric layer, wherein the mesh-shaped gate electrode comprises a plurality of first elongate wirings extending parallel to one another, and a plurality of second elongate wirings extending parallel to one another, and wherein the first elongate wirings intersect the second elongate wirings to define an array of sate intersection regions over the surface of the substrate and to further define an array of source/drain regions of the substrate, and said semiconductor device further comprising:

a first dielectric layer formed over the semiconductor substrate and the mesh-shaped gate electrode;

a plurality of elongate first electrodes located over said first dielectric layer and extending parallel to each other and diagonally over said array of source/drain regions;

a second dielectric layer formed over said first dielectric layer and said first electrodes;

a plurality of elongate second electrodes located over said second dielectric layer and extending parallel to each other and diagonally over said array of source/drain regions;

wherein said first electrodes are electrically connected through said first dielectric layer to either source or drain regions among said array of source/drain regions, and wherein said second electrodes are electrically connected through said first and second dielectric layers to the other of source or drain regions among said array of source/drain regions.

8. The semiconductor device as claimed in claim 7, wherein said first electrodes and said second electrodes are alternately arranged over said substrate.

9. The semiconductor device as claimed in claim 7, wherein said first electrodes and said second electrodes are arranged perpendicularly to each other over said substrate.

10. The semiconductor device as claimed in claim 7, further comprising:

a common first electrode connected to said plurality of first electrodes; and a common second electrode connected to said plurality of second electrodes.

11. A semiconductor device comprising;

a substrate;

a mesh-shaped gate electrode located over a surface of the substrate, the mesh-shaped gate electrode having a plurality of openings aligned over respective source/drain regions of the substrate;

a gate dielectric layer interposed between the mesh-shape gate electrode and the surface of the substrate; and at least one oxide region located in the substrate below the mesh-shaped gate electrode, wherein a thickness of the oxide region is greater than a thickness of the gate dielectric layer, wherein the mesh-shaped gate electrode comprises a plurality of first elongate wirings extending parallel to one another, and a plurality of second elongate wirings extending parallel to one another, and wherein the first elongate wirings intersect the second elongate wirings to define an array of gate intersection regions over the surface of the substrate and to further define an array of source/drain regions of the substrate, and said semiconductor device further comprising:

a first dielectric layer formed over the semiconductor substrate and the mesh-shaped gate electrode;

a first mesh-shaped electrode located over said dielectric layer, said first mesh-shaped electrode comprising a plurality of third elongate wirings extending parallel to one another and diagonally over said array of source/drain regions, and a plurality of fourth elongate wirings extending parallel to one another and diagonally over said array of source/drain regions, and wherein said third elongate wirings intersect said fourth elongate wirings;

a second dielectric layer formed over said first dielectric layer and said first mesh-shaped electrode;

a second mesh-shaped electrode located over said second dielectric layer, said second mesh-shaped electrode comprising a plurality of fifth elongate wirings extending parallel to one another and diagonally over said array of source/drain regions, and a plurality of sixth elongate wirings extending parallel to one another and diagonally over said array of source/drain regions, and wherein said fifth elongate wirings intersect said sixth elongate wirings;

wherein said first mesh-shaped electrode is electrically connected through said first dielectric layer to either source or drain regions among said array of source/drain regions, and wherein said second mesh-shaped electrode is electrically connected through said first and second dielectric layers to the other of source or drain regions among said array of source/drain regions.

12. A semiconductor device comprising:

a substrate;

a mesh-shaped gate electrode located over a surface of the substrate, the mesh-shaped gate electrode having a plurality of openings aligned over respective source/drain regions of the substrate, and defining an array of gate intersection regions over the surface of the substrate and an array of source/drain regions of the substrate;

a gate dielectric layer interposed between the mesh-shape gate electrode and the surface of the substrate; and at least one oxide region located in the substrate below the intersection region of the gate electrode, wherein a thickness of the oxide region is greater than a thickness of the gate dielectric layer;

a dielectric layer formed over the semiconductor substrate and the mesh-shaped gate electrode;

a plurality of elongate first electrodes located over said dielectric layer and extending parallel to each other and diagonally over said array of source/drain regions;

a second dielectric layer formed over said first dielectric layer and said first electrodes;

a plurality of elongate second electrodes located over said dielectric layer and extending parallel to each other and diagonally over said array of source/drain regions;

wherein said first electrodes are electrically connected through said first dielectric layer to either source or drain regions among said array of source/drain regions, and wherein said second electrodes are electrically connected through said first and second dielectric layers to the other of source or drain regions among said array of source/drain regions.

13. The semiconductor device as claimed in claim 12, wherein the at least one oxide region comprises an array of oxide regions located below the array of gate intersection regions, respectively.

14. The semiconductor device as claimed in claim 12, wherein said first electrodes and said second electrodes are alternately arranged over said substrate.

15. The semiconductor device as claimed in claim 12, wherein said first electrodes and said second electrodes are arranged perpendicularly to each other over said substrate.

16. The semiconductor device as claimed in claim 12, further comprising a common first electrode connected to said plurality of first electrodes, and a common second electrode connected to said plurality of second electrodes.

17. The semiconductor device as claimed in claim 12, wherein the at least one oxide region is at least one field oxide region.

18. The semiconductor device as claimed in claim 12, wherein the at least one oxide region comprises a plurality of elongate oxide regions extending parallel to each other.

19. The semiconductor device as claimed in claim 18, wherein each of the plurality of elongate oxide regions have opposite ends which terminate at first and second elongate side oxide regions extending perpendicular to said plurality of elongate oxide regions.

20. A semiconductor device comprising:

a substrate having an array of source/drain regions;

a mesh-shaped gate electrode located over a surface of the substrate, the mesh-shaped gate electrode having a plurality of openings aligned over respective ones of said array of source/drain regions of the substrate;

a gate dielectric layer interposed between the mesh-shape gate electrode and the surface of the substrate;

at least one oxide region located in the substrate below the mesh-shaped gate electrode, wherein a thickness of the oxide region is greater than a thickness of the gate dielectric layer;

a dielectric layer formed over the semiconductor substrate and the mesh-shaped gate electrode;

a plurality of elongate drain electrodes located over the dielectric layer and extending parallel to each other and diagonally over said array of source/drain regions; and a plurality of elongate source electrodes located over said dielectric layer and extending parallel to each other and diagonally over said array of source/drain regions;

wherein source electrodes and said drain electrodes are alternately arranged over said dielectric layer, and wherein each of the plurality of elongate drain electrodes terminate at one end at a first L-shaped common wiring, and each of the plurality of elongate source electrodes terminate at one end at a second L-shaped common wiring.

21. The semiconductor device as claimed in claim 20, wherein the at least one oxide region comprises an array of oxide regions located below gate intersection regions of the mesh-shaped gate electrode, respectively.

22. The semiconductor device as claimed in claim 20, wherein the elongate drain electrodes and the elongate source electrodes are coplanar.

23. The semiconductor device as claimed in claim 20, wherein the at least one oxide region is at least one field oxide region.

24. A semiconductor device comprising:

a substrate having an array of source/drain regions;

a mesh-shaped gate electrode located over a surface of the substrate, the mesh-shaped gate electrode having a plurality of openings aligned over respective ones of said array of source/drain regions of the substrate;

a gate dielectric layer interposed between the mesh-shape gate electrode and the surface of the substrate;

at least one oxide region located in the substrate below the mesh-shaped gate electrode, wherein a thickness of the oxide region is greater than a thickness of the gate dielectric layer;

a dielectric layer formed over the semiconductor substrate and the mesh-shaped gate electrode;

a plurality of elongate drain electrodes located over the dielectric layer and extending parallel to each other and diagonally over said array of source/drain regions; and a plurality of elongate source electrodes located over said dielectric layer and extending parallel to each other and diagonally over said array of source/drain regions;

wherein source electrodes and said drain electrodes are alternately arranged over said dielectric layer, and wherein the at least one oxide region comprises a plurality of elongate oxide regions extending parallel to each other and lengthwise below elongate wirings of the mesh-shaped gate electrode.

25. The semiconductor device as claimed in claim 24, wherein each of the plurality of elongate oxide regions have opposite ends which terminate at first and second elongate side oxide regions extending perpendicular to said plurality of elongate oxide regions.

26. A semiconductor device comprising:

a substrate;

a first mesh-shaped electrode located over a surface of the substrate;

a first dielectric layer interposed between the first mesh-shaped electrode and the surface of the substrate;

a second dielectric layer formed over the first mesh-shaped electrode;

a second mesh-shaped electrode located over said second dielectric layer;

a third dielectric layer formed over the second mesh-shaped electrode; and a third mesh-shaped electrode located over said third dielectric layer.

27. A semiconductor device as claimed in claim 26, wherein the first mesh-shaped electrode is gate electrode and the first dielectric layer is gate dielectric layer.

28. A semiconductor device as claimed in claim 27, wherein the first mesh-shaped electrode includes a plurality of openings aligned over the substrate and defines an array of gate intersection regions over the substrate and an array of source/drain regions over the substrate.

29. A semiconductor device as claimed in claim 28, wherein the second mesh-shaped electrode is connected to one of the source/drain regions and the third mesh-shaped electrode is connected the other of the source/drain regions.

30. A semiconductor device as claimed in claim 28, further comprising at least one oxide region located in the substrate below the first mesh-shaped electrode, wherein a thickness of the oxide region is greater than a thickness of the first dielectric layer.

31. A semiconductor device as claimed in claim 30, wherein the oxide region is a field oxide region.

* * * * *